United States Patent [19]

Vagt, Jr.

[11] 4,059,806
[45] Nov. 22, 1977

[54] PULSE POSITION DEMODULATOR CIRCUIT

[75] Inventor: Henry Tyrrell Vagt, Jr., Scarsdale, N.Y.

[73] Assignee: The Singer Company, Little Falls, N.J.

[21] Appl. No.: 741,759

[22] Filed: Nov. 15, 1976

[51] Int. Cl.² ............................................. H03K 9/04
[52] U.S. Cl. ................................... 329/107; 325/321; 329/50; 343/108 R
[58] Field of Search ......................... 329/104, 107, 50; 325/321; 343/108 R, 108 M, 108 SM

[56] References Cited

U.S. PATENT DOCUMENTS

| 3,767,855 | 10/1973 | Ueno et al. | 329/107 X |
| 3,980,820 | 9/1976 | Niemi et al. | 325/321 X |

Primary Examiner—Siegfried H. Grimm
Attorney, Agent, or Firm—Thomas W. Kennedy

[57] ABSTRACT

A pulse position demodulator circuit is provided which finds particular use in instrument landing systems, but which has general utility. The system responds to a pulse signal in which successive pulse pairs are position modulated in accordance with an incremental modulating signal, and it provides digital outputs which are precise measurements of the time spacing between the pulses of each individual pair, the digital outputs constituting a representation of the modulating incremental signal. The system includes a network for generating a multiplicity of clock signals having different phase relationships. A particular clock is selected by the lead pulse of each received pulse pair to enable a correct digital output to be produced by the system even though the second pulse of the pair may be received earlier or later than a particular reference time. This reduces the resolution requirements of the system without affecting its accuracy, thereby permitting a low speed shift register to be used of the order of one-fourth the length of the shift register which would be required in an equivalent prior art system.

8 Claims, 4 Drawing Figures

PULSE POSITION DEMODULATOR CIRCUIT

BACKGROUND OF THE INVENTION

It is usual in instrument landing systems to transmit a ground signal to a landing aircraft in which successive pulses contain angle and other information. It is also usual to transmit a second pulse for each successive pulse in the signal so as to create a subcession of pulse pairs which are position modulated by an incremental signal to identify the information in the main signal as azimuth, elevation, and the like. A pulse position demodulator circuit is provided in each of the landing aircraft for detecting the time spacing between the pulses of the received pulse pairs, so as to provide a demodulated signal which indicates to the system whether the received angle information is azimuth, elevation, or the like.

As mentioned above, the pulse position demodulator circuit of the present invention has particular utility in such instrument landing systems. However, it will become apparent as the description proceeds that the pulse demodulator circuit of the invention has general utility as a pulse position demodulator capable of generating a digital output which is a function of the incremental modulation of the spacing between the pulses of a received pulse signal, where the modulation consists of fixed incremental changes in the pulse spacing.

The prior art demodulator circuits of the same general type as the demodulator of the present invention require a shift register with high resolution which is usually four times the pulse spacing increment. This means that the shift register must be relatively long and relatively high speed, so that the circuitry in the prior art demodulator circuits is relatively complex, and the power requirements are relatively high.

The pulse position demodulator circuit of the present invention, on the other hand, may be constructed to use less than half the integrated circuits of the prior art demodulators, to consume less than one-third the power, and to require a shift register of one-fourth the length of the shift register used in the prior art demodulators. The pulse position demodulator circuit of the present invention, in the embodiment to be described, utilizes digital techniques, and it employs medium scale integration (MSI) components.

DETAILED DESCRIPTION OF THE ILLUSTRATED EMBODIMENT

Figure 1:
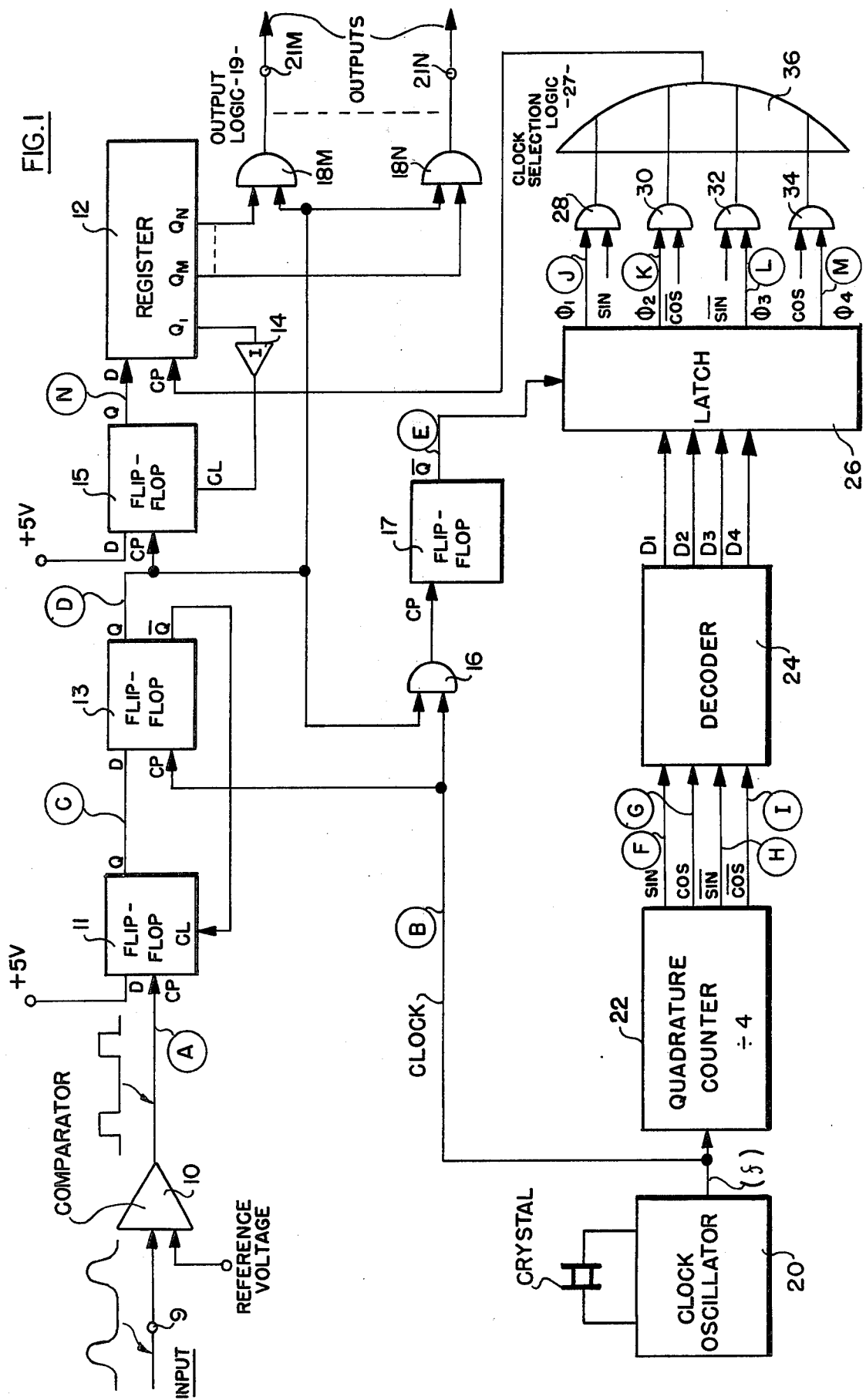
FIG. 1 is a block diagram of a pulse position demodulator circuit constructed in accordance with one embodiment of the invention.

In the demodulator circuit of FIG. 1, a pulse signal from the intermediate frequency stage of the aircraft receiver is introduced to an input terminal 9 which is connected to a fast comparator 10. The other input terminal of the comparator is connected to an appropriate source of reference voltage. The output of the comparator is connected to the clock input of a flip-flop 11, whose data input is connected to the positive terminal of a 5-volt source. The Q output of flip-flop 11 is connected to the data input of a flip-flop 13, and the Q output of the latter flip-flop is connected to the clock input of a flip-flop 15. The Q output of flip-flop 15 is connected to the data input of a shift register 12. The $\overline{Q}$ output of flip-flop 13 is connected to the clear input of flip-flop 11, whereas the Q1 output of register 12 is connected through an inverter 14 to the clear input of flip-flop 15.

The outputs from register 12 are taken between the outputs $Q_M$ and $Q_N$, and these outputs are connected to a corresponding series of "and" gates 18M–18N, in output logic 19, and the outputs appear across a corresponding series of output terminals 21M–21N.

The demodulator circuit includes a crystal controlled clock oscillator 20 which may generate a clock signal at a repetition frequency, for example, of 8 megahertz. The clock oscillator 20 is connected to the clock input of flip-flop 13 and to an "and" gate 16. The second input of "and" gate 16 is connected to the Q output of flip-flop 13, and the "and" gate is connected to the clock input of a flip-flop 17.

The clock oscillator 20 also supplies clock pulses to a divide by four quadrature counter 22 whose outputs are connected to a decoder 24. The decoder 24, in turn, introduces its outputs to a latch circuit 26, the latch circuit being operated by the $\overline{Q}$ output of flip-fop 17. The outpus 01, 02, 03 and 04 of the latch circuit are applied to respective "and" gates 28, 30, 32 and 34 in clock selection logic 27, the outputs of the "and" gates being connected through an "or" gate 36 to the clock input of register 12.

Figure 2:
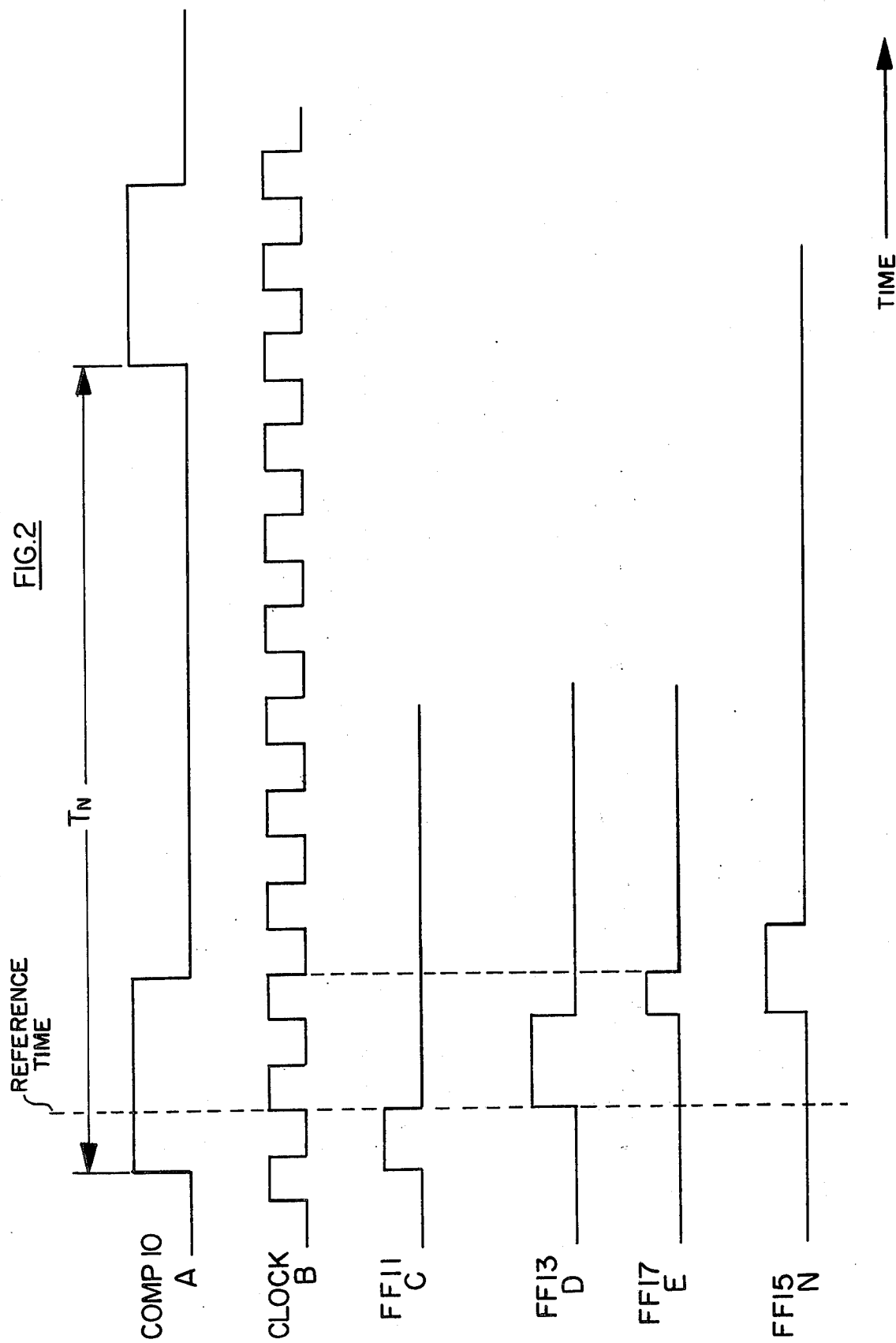
FIG. 2 is a series of curves useful in explaining a portion of the demodulator circuit of FIG. 1.

The pulses derived from the intermediate frequency stage of the receiver in which the demodulator circuit of FIG. 1 is incorporated, are converted to transistor-transistor logic (TTL) levels in Comparator 10 (curve A - FIG. 2). Flip-flop 11 is set on the positive-going transistion of each pulse output of the comparator (curve C of FIG. 2), and the next positive-going transition of a clock pulse $f_1$ from clock oscillator 20 (curve B of FIG. 2) causes flip-flop 13 to be set (curve D of FIG. 2), and this action resets the flip-flop 11. When flip-flop 13 is set, the positive-going edge of the next clock pulse resets flip-flop 13 (curve D of FIG. 2). When flip-flop 13 is reset, flip-flop 15 is set (curve N of FIG. 2), which enables the shift register 12. The first bit output of the shift register resets flip-flop 15. However, propagation down the shift register continues, as the shift register is clocked in a manner to be described.

It will be evident, therefore, that flip-flop 15 is set for an interval equal to one 8 mhz clock pulse, which is .125 microseconds in the embodiment under consideration. The width of the pulse that is propagated down the shift register 12 is .5 microseconds, however, the propagation of the pulse down the shift register continues until the second pulse of the pair is received. When that occurs, flip-flop 11 is again set, and the next positive transition of the clock pulse $f_1$ from the clock oscillator 20 sets flip-flop 13. The setting of flip-flop 13 enables a corresponding one of the "and" gates 18M–18N so that a pulse occurs on the output line connected to that particular gate. The pulse is an indication of the selected time spacing between the two pulses of the received pulse pair. As this time spacing changes incrementally for successively received pulse pairs, pulses appear on different ones of the output lines, and at different ones of the output terminals 21M–21N, as the incremental modulation of the successive pulse pairs is demodulated in the circuit.

To reiterate, in the pulse demodulator circuit of FIG. 1, incoming pulse pairs are converted to TTL logic levels in the fast comparator 10, and flip-flop 11 goes true on the positive edge of each of the two pulses of each pulse pair. Flip-flop 13, on the other hand, generates a pulse which is one clock period wide for each incoming pulse of the pulse pair, and which is synchronized with the clock of the demodulator circuit. This operation is known as "quantizing." In a constructed embodiment of the invention, six increments in the pulse modulation occur, and each increment is four times the quantizing period. The incremental modulations in the constructed embodiment, for example, occur in 0.5 microsecond increments. This then is the minimum increment in the shift register 12. The shift clock for the register in the constructed embodiment is 2 megahertz, which is one-fourth the repetition frequency of the clock oscillator 20. This shift clock is the critical timing signal for the demodulator circuit.

Figure 3:
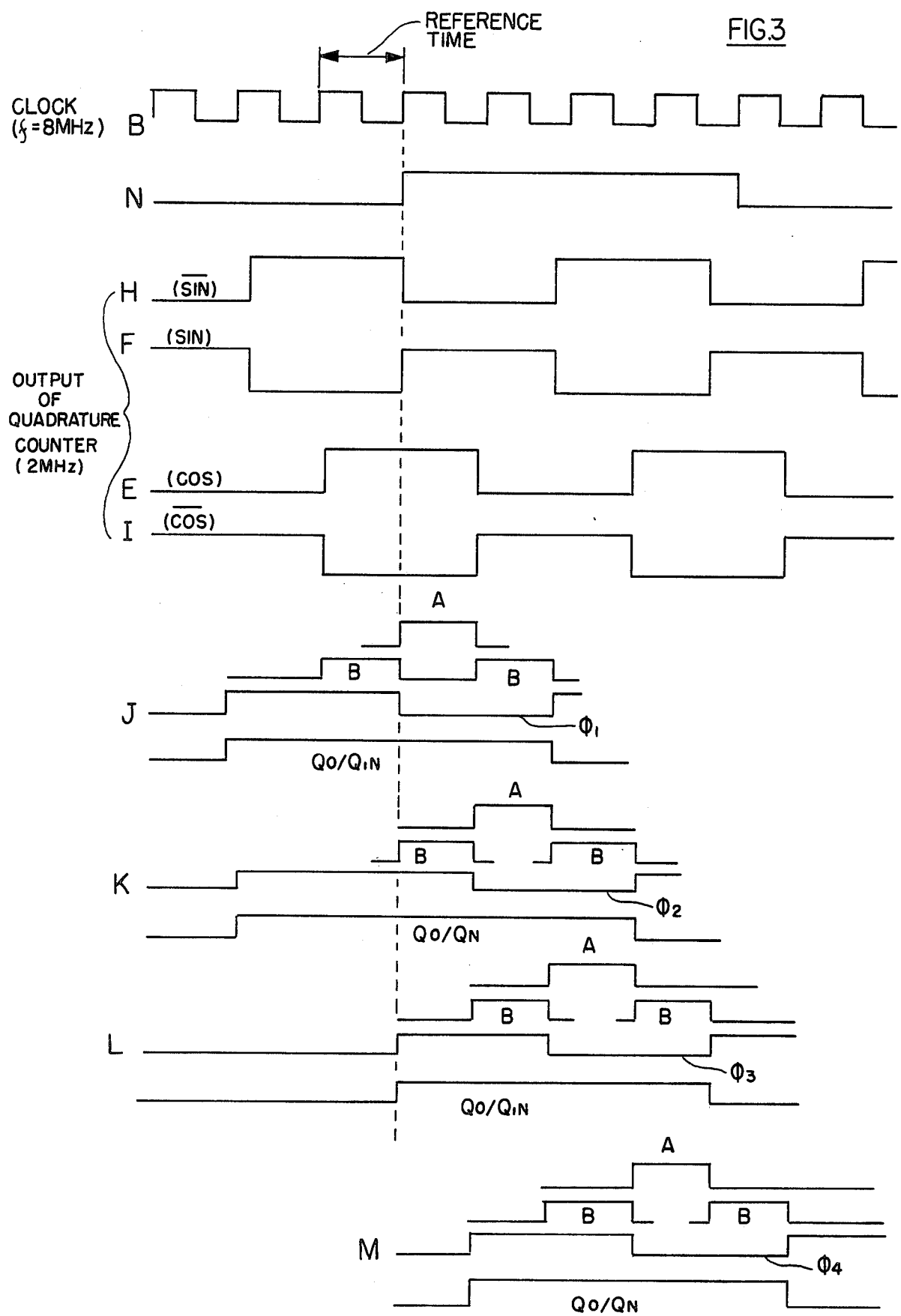
FIG. 3 is a series of curves useful in explaining a second portion of the circuit of FIG. 1.

The time arrival of the lead pulse of a received pair is random with respect to the shift clock of the demodulator circuit, and the time of arrival of the second pulse is dependent on transmitter and receiver timing tolerances. If a tolerance of just less than one quantizing period be assumed for the pulses of any received pair, the position of the quantized first and second pulses of the pair will have a timing relative to the internal signals of the system as shown by the curves of FIGS. 2 and 3.

Since the position modulation increment of the received pulse pairs is four times the quantizing period in the embodiment under consideration, there are four possible positions of the first pulse of a pair relative to demodulator timing. These are the A pulses in the four lower curves in FIG. 3. The second pulse of the pair (curve N) can occur at the A location which represents a zero tolerance; or at either B locations, which represent a tolerance of one quantizing period "early" or "late."

In order for the .5 microsecond resolution of the shift register 12 to be properly placed in time, the timing of the shift clock for the register must be synchronized with the first quantized pulse of each received pulse pair. This is achieved by generating four clock signals whose positive transitions are one quantizing interval apart. This is achieved by quadrature counter 22 which responds to clock pulses from clock oscillator 20 to generate four outputs designated sin, $\overline{sin}$, cos and $\overline{cos}$, respectively (curves H, F, G and I of FIG. 3). Decoder 24 responds to the outputs to produce corresponding output pulses D1, D2, D3 and D4 which are introduced to latch 26.

Figure 4:
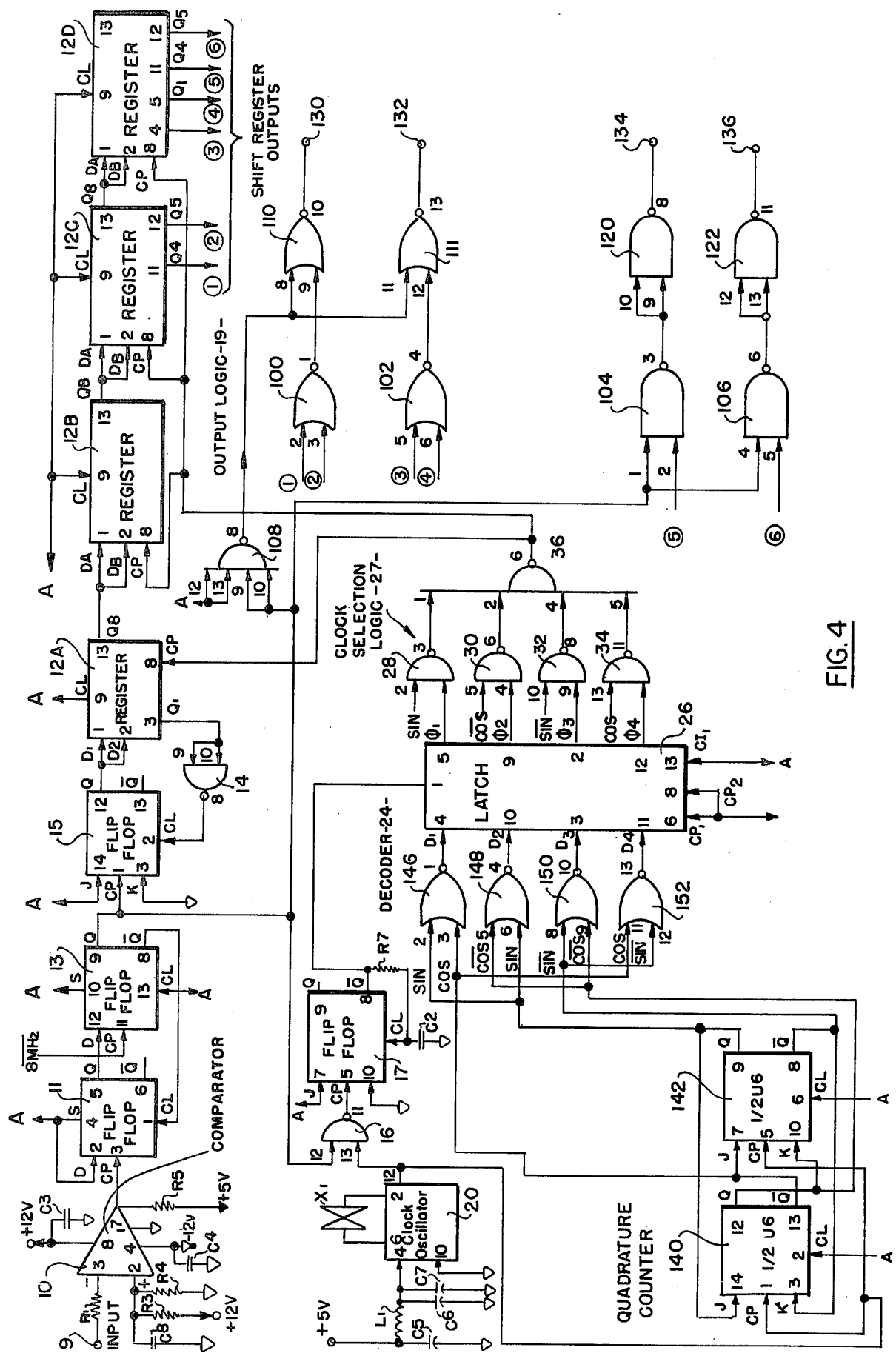
FIG. 4 is a more detailed logic diagram of the pulse position demodulator circuit of FIG. 1.

Latch 26 responds to flip-flop 17 to select any one of the four outputs, and to cause a corresponding one of its outputs ∅1, ∅2, ∅3 or ∅4 to enable one of the gates 28, 30, 32 and 34 in the clock selection logic 27, so that a selected one of the four outputs of counter 22 may be used to clock the shift register (curves J, K, L and M of FIG. 4). The four shift register clocks are formed in accordance with the following logic equations:

∅1 = sin.cos
∅2 = sin.$\overline{cos}$
∅3 = $\overline{sin}$.$\overline{cos}$
∅4 = $\overline{sin}$.cos.

The first quantized pulse of a received pulse pair enables gate 16 so that the next clock pulse from oscillator 20 sets flip-flop 17 (curve E of FIG. 2) to select the clock for the shift register 12. This is the function of flip-flop 17, decoder 24, latch 26 and the clock selection logic 27 in the system of FIG. 3.

The timing of the positive-going edges of the four shift register clocks result in four .5 microsecond intervals which bracket all three possible times of arrival of the second pulse of the received pair. It will be noted that one quantizing period at the start of each 0.5 microsecond interval is open. This open interval is provided for delay compensation or shift register 12 so that a slower and therefore lower power register may be used instead of the register which would normally be required.

As explained above, the entry of the first pulse of a received pair into shift register 12 is accomplished by flip-flop 15. Triggering of flip-flop 15 occurs on the trailing edge of the quantized pulse after the shift clock phase has been accepted by flip-flop 17. The first bit Q1 of the shift register is used to reset flip-flop 15 (curve N of FIG. 2), as also explained above, thus assuring that a 0.5 microsecond pulse is propagated down the shift register. The output from the system is the logical product of the quantized pulse and the selected output of the shift register as accomplished by "and" gates 18M–18N in the output logic 19.

The quantizing circuit flip-flops 11 and 13 provide a means for synchronizing the non-synchronous received signals with the internal clocks. This synchronization results in a fixed time difference between the quantized electrical signal and the internal clock. A shift clock of variable phase is provided for the shift register so that a slow, low power shift register with a minimal number of stages may be used. Although a quadrature counter of the type used in sine/cosine Doppler trackers has been described in the system of FIG. 1 to generate the four clock phases in that particular embodiment, other counters and other numbers of phases may be selected to accomplish the desired results of the invention.

As stated above, the demodulator circuit of FIG. 1 is shown in more detail in FIG. 4. In FIG. 4, the input terminal 9 is connected through a 390 ohm resistor R1 to the negative input of comparator 10 which may be of the type designated LM106. The positive input of the comparator is connected through a 4750 ohm resistor R3 to the positive terminal of a 12-volt source, and through a 280 ohm resistor R4 to ground. Resistor R4 is shunted by a 330 microfarad capacitor C8. Pin 4 of comparator 10 is connected to the negative terminal of a 12-volt source, and to a grounded 0.01 microfarad capacitor C4. Pin 8 is connected to the positive terminal of the 12-volt source and to a grounded 0.01 microfarad capacitor C3.

The output of the comparator is connected through a 470 ohm resistor R5 to the positive terminal of the 5-volt source and to the clock terminal 3 of flip-flop 11. The Q output terminal flip-flop 11 is connected to the D input terminal of flip-flop 13, and the Q output terminal of flip-flop 13 is connected to the CP input terminal of flip-flop 15, and to "and" gate 16. Flip-flop 16 is connected to the CP input terminal of NAND Gate 17. Flip-flops 11 and 13 may each comprise one-half an integrated circuit of the type designated SN5474, the flip-flops 15 and 17 may each be one-half an integrated circuit of the type designated SN5473.

The Q output of flip-flop 15 is connected to the D inputs of the first stage 12A of the shift register. The Q8 output of the integrated circuit 12A is connected to the D input of the second stage 12B of the shift register which, in turn, is connected to a third stage 12C which is connected to a fourth stage 12D. The register stages may each be an integrated circuit of the type designated SN 54L164. The shift register outputs are derived from the register stages 12C and 12D, and these are designated 1, 2, 3, 4, 5 and 6.

The outputs 1 and 2 are applied to a "nor" gate 100 in the output logic 19, the outputs 3 and 4 are applied to a "nor" gate 102, and the outputs 5 and 6 are applied to respective 37 nand" gates 104, 106. The Q output of flip-flop 13 is introduced to "nand" gates 104, 106, and to an integrated circuit 108 which may be one-half an integrated circuit of the type designated SN5420. The output of integrated circuit 108 is applied to "nor" gates 110 and 111, together with the outputs of respective "nor" gates 100 and 102.

"Nand" gates 104 and 106 are connected to further "nand" gates 120 and 122 which serve as inverters. The "nor" gates 110 and 111 are connected to respective output terminals 130 and 132 of the demodulator, whereas the "nand" gates 120 and 122 are connected to respective output terminals 134 and 136 of the demodulator.

The clock oscillator 20 may be of the type designated CT837. Pins 2 and 6 are connected to a crystal X1. Pin 10 is grounded. Pin 4 is connected to a 15 microhenry inductance coil L1 which, in turn, is connected to the positive terminal of the 5-volt source and to a grounded variable capacitor C5 which may have a capacity in a range of 6.8 – 35 microfarads. Pin 4 is also connected to a grounded variable capacitor C6 which, likewise, may have a range of 6.8 – 35 microfarads. Capacitor C6 is shunted by a 0.1 microfarad capacitor C7. Output pin 12 of the clock oscillator generates the 8 megahertz clock which is introduced to "nand" gate 16. "Nand" gate 16 is connected to the clock input of flip-flop 17. "Nand" gate 16 may be one-quarter of an integrated circuit of the type designated SN5400. Flip-flop 17 may be one-half an integrated circuit of the type designated SN5473.

Clock oscillator 20 is also connected to a quadrature counter which, in this embodiment is formed of a pair of flip-flops 140 and 142, each of which may be one-half an integrated circuit of the type designated SN5473. The flip-flops 140 and 142 are connected as the quadrature counter 22 and generate the signals cos, sin, $\overline{\text{sin}}$ and $\overline{\text{cos}}$. These signals are applied to the "nor" gates such that the sin and cos signals ar applied to "nor" gate 146, the $\overline{\text{cos}}$ and sin signals are applied to "nor" gate 148, the $\overline{\text{sin}}$ and $\overline{\text{cos}}$ signals are applied to "nor" gate 150, and the cos and $\overline{\text{sin}}$ signals are applied to "nor" gate 152.

The outputs of the four gates, designated D1, D2, D3 and D4 are introduced to the latch circuit 26. Latch circuit 26 may be an integrated circuit of the type designated SN54197. The pins 5, 9, 2 and 12 of the latch are connected to "nand" gates 28, 30, 32 and 34 in the clock selection logic 27. The signal sin, $\overline{\text{cos}}$, $\overline{\text{sin}}$ and cos are also applied to the "nand" gates. The outputs of the "nand" gates are connected to "nor" gate 36 which may be one-half an integrated circuit of the type designated SN5420. The output of gate 36 is connected to the clock pulse input of register 12A, and to the clock pulse inputs of registers 12B, 12C and 12D.

The invention provides, therefore, a pulse position demodulator circuit which operates efficiently and with a high degree of precision, and yet which requires a low power, low speed shift register, as compared with the prior art demodulator circuits of this general type. This leads to a reduction in circuit complexity and power requirements, as compared with the prior art circuits, and yet the circuit of the invention operates with the same resolution and same degree of accuracy as the more complex and more expensive prior art circuits.

While a particular embodiment of the invention has been shown and described, modifications may be made. It is intended in the claims to cover all the modifications which come within the spirit and scope of the invention.

What is claimed is:

1. A pulse position demodulator circuit for providing digital outputs representative of the time spacing between received incrementally modulated pulse pairs, said circuit comprising:
   a clock oscillator for generating a clock signal of relatively high frequency;
   quantizing circuit means coupled to the clock oscillator for producing quantized pulses synchronized with said clock signal in response to the received modulated pulse pairs;
   shift register means;
   means coupling said quantizing circuit means to said shift register means for propagating the quantized pulses down the shift register means;
   first circuit means coupled to the clock oscillator for producing a plurality of clock signals and having predetermined mutual phase relationships with one another;
   further circuit means coupling the quantizing circuit means to said first circuit means to select one of said plurality of clock signals for application to said shift register as determined by the timing of the first quantizing pulses of each of the received pairs with respect to a selected reference; and
   output circuit means obtaining inputs from said shift register means providing said digital outputs.

2. The pulse position demodulator circuit defined in claim 1, and which includes an input circuit including a comparator for receiving the incrementally modulated pulse pairs, and for introducing square wave signals corresponding thereto to said quantizing circuit means.

3. The pulse position demodulator circuit defined in claim 1, in which said first circuit means includes counter means, decoder means, and a latch circuit for producing said plurality of clock signals.

4. The pulse position demodulator circuit defined in claim 3, in which said further circuit means is connected to said latch circuit in said first circuit means.

5. The pulse position demodulator circuit defined in claim 4, and which includes clock selection logic coupled to the output of said latch circuit for selecting one of the plurality of clock signals for application to said shift register, as determined by the latch circuit.

6. The pulse position demodulator circuit defined in claim 5, in which said counter means produces sine and cosine related outputs.

7. The pulse position demodulator circuit defined in claim 1, in which said quantizing circuit comprises a pair of flip-flops interconnected, and one of said flip-flops being connected to said clock oscillator, for producing said quantized pulses in response to the received modulated pulse pairs synchronized with said clock signal.

8. The pulse position demodulator circuit defined in claim 1, in which said coupling means for coupling said quantizing circuit means to said shift register means comprises a flip-flop.

* * * * *